United States Patent
Wang et al.

(10) Patent No.: US 6,403,418 B2
(45) Date of Patent: *Jun. 11, 2002

(54) METHOD OF FABRICATING CUP-SHAPE CYLINDRICAL CAPACITOR OF HIGH DENSITY DRAMS

(75) Inventors: Shiou-Yu Wang, Taipei; Jia-Shyong Cheng, Hsinchu; Tean-Sen Jen, ChiaYi; Ming-Teng Hsieh, Taipei Hsieh, all of (TW)

(73) Assignee: Nanya Technology Corporation, Taoyuan (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/551,535

(22) Filed: Apr. 18, 2000

Related U.S. Application Data

(63) Continuation of application No. 09/006,300, filed on Jan. 14, 1998, now abandoned.

(30) Foreign Application Priority Data

Jul. 29, 1997 (TW) .................................. 86106703 A

(51) Int. Cl.[7] .......................................... H01L 21/8242
(52) U.S. Cl. ........................................ 438/253; 438/254
(58) Field of Search ................................ 438/253–256, 438/396–399

(56) References Cited

U.S. PATENT DOCUMENTS

| | | | | |
|---|---|---|---|---|
| 5,436,187 A | * | 7/1995 | Tanigawa | |
| 5,580,813 A | * | 12/1996 | Hachisuka et al. | |
| 5,629,225 A | * | 5/1997 | Iwakiri et al. | |
| 5,688,726 A | * | 11/1997 | Kim | |
| 5,691,229 A | * | 11/1997 | Okamura et al. | |
| 6,096,597 A | * | 8/2000 | Tsu et al. | 438/240 |

* cited by examiner

Primary Examiner—Jey Tsai
(74) Attorney, Agent, or Firm—Bacon & Thomas

(57) ABSTRACT

A method of fabricating cup shape cylindrical capacitor of high density Dynamic Random Access Memory (DRAM) cells is disclosed. The cup shape capacitor shape is achieved by first depositing a first polysilicon layer on a silicon substrate; a third dielectric layer is then formed overlaying the first polysilicon layer, and defined third dielectric crowns by the conventional lithography and etching techniques; a second polysilicon layer is deposited overlaying the third dielectric crowns and first polysilicon layer; the first polysilicon and second polysilicon layers are then vertically anisotropically etchback to define storage nodes of the cylindrical capacitors; the third dielectric crowns are removed; finally, the capacitor dielectric layer and the polysilicon top plate of the capacitor are formed to complete the cup shape cylindrical capacitor formation for high density DRAM applications.

10 Claims, 7 Drawing Sheets

METHOD OF FABRICATING CUP-SHAPE CYLINDRICAL CAPACITOR OF HIGH DENSITY DRAMS

This application is a continuation of application Ser. No. 09/006,500, filed Jan. 14, 1998, (of which the entire disclosure of the pending, prior application is hereby incorporated by reference), abandoned.

BACKGROUND OF THE INVENTION (1) Field of the Invention

The present invention relates to a method of fabricating the capacitors of dynamic random access memory (DRAM) cells, and more particularly to the cup-shape cylindrical capacitor structure of high density DRAMs.

(2) Description of the Related Art

A DRAM cell comprises a metal-oxide-semiconductor field effect transistor (MOSFET) and capacitors which are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to produce DRAMs.

In recent years, the sizes of the MOSFETs and capacitors have become continuously smaller so that the packing densities of these DRAM devices have increased considerable. For example, a number of semiconductor manufacturing companies in the world have already begun mass production of 16 M bit or even 64 M bit DRAMs.

As the sizes of the capacitors become smaller, so that the capacitance values of the capacitors are decreasing, that reduces the signal to noise ratio of the DRAM circuits, causing the performance problem. The issue of maintaining or even increasing the surface area of the storage nodes or reducing the thickness of the dielectric layer is particularly important as the density of the DRAM arrays continues to increase for future generations of memory devices.

When the capacitor is used to fabricate 16 Mbit DRAMs and beyond, increasing the capacitor surface area becomes a top priority. Various shapes of capacitor structures have been used to address this issue. U.S. Pat. No. 5,185,282 to Lee et al. (the entire disclosure of which is herein incorporated by reference) provides a method of fabricating cup-shaped capacitor storage node. Another U.S. Pat. No. 5,021,357 to Taguchi et al. (the entire disclosure of which is herein incorporated by reference) discloses a method of fabricating fin structure capacitor electrode. These capacitor structures can effectively increase the capacitance values of the capacitors, however, these processes are too complicated and highly fastidious. They are difficult to be practically employed for DRAM mass-production.

SUMMARY OF THE INVENTION

Accordingly, it is a primary object of the present invention to provide a method for fabricating a DRAM cell fabrication with greater capacitance per unit area.

It is another object of the present invention to provide a method of fabricating the stack capacitor structure of the high density DRAMs.

It is a further object of the present invention to provide an easy and manufacturable process for high density DRAMs that can reduce the processing steps and fabrication cost.

These objects are accomplished by the fabrication process described below.

First, a field oxide layer for isolation is grown on the semiconductor silicon substrate by standard integrated circuit fabrication process. Then, bitlines and MOSFET regions which include gate oxides, gate electrodes and source/drain regions are formed on the semiconductor silicon substrate.

Next, a first dielectric and a second dielectric layers are sequentially deposited. The first dielectric layer is planarized and the first and second dielectric layers are then etched by plasma-etching to expose the source regions of the MOSFET in order to form cell contact windows of the DRAMs.

Then, the first polysilicon layer which is overlaying the second dielectric layer and filling into the cell contacts is formed. The next step is the key point of the present invention, a third dielectric layer is formed overlaying the first polysilicon layer, and defined into third dielectric crowns by the conventional lithography and etching techniques.

Next, a second polysilicon layer is deposited overlaying the third dielectric crowns and first polysilicon layer. The first polysilicon and second polysilicon layers are then vertically anisotropically etchback to define storage nodes of the cylindrical capacitors. Therefore, the third dielectric crowns are removed by hydrofluoric acid (HF).

Finally, the capacitor dielectric layer and the polysilicon top plate of the capacitor are formed by standard integrated circuit technologies. Therefore, the cup shape cylindrical capacitor for high density DRAM applications is accomplished.

BRIEF DESCRIPTION OF THE DRAWINGS

The accompanying drawings forming a material part of this description, in which:

FIG. 1 is a cross sectional representation of the DRAM cell after the second dielectric layer is formed.

FIG. 2 is a cross sectional representation of the DRAM cell of FIG. 1 after the sidewall spacers are formed in the contact window.

FIG. 3 is a cross sectional representation of the DRAM cell of FIG. 2 after the third dielectric layer is formed.

FIG. 4 is a cross sectional representation of the DRAM cell of FIG. 3 after the third dielectric crown and second polysilicon layer are formed.

FIG. 5 is a cross sectional representation of the DRAM cell of FIG. 4 after the cup-shape capacitor storage node is formed.

FIG. 6 is a cross sectional representation of the DRAM cell of FIG. 5 after the third dielectric crown is removed.

FIG. 7 is a cross sectional representation of the DRAM cell after the final capacitor structure is completed.

DESCRIPTION OF THE PREFERRED EMBODIMENT

Figure 1:
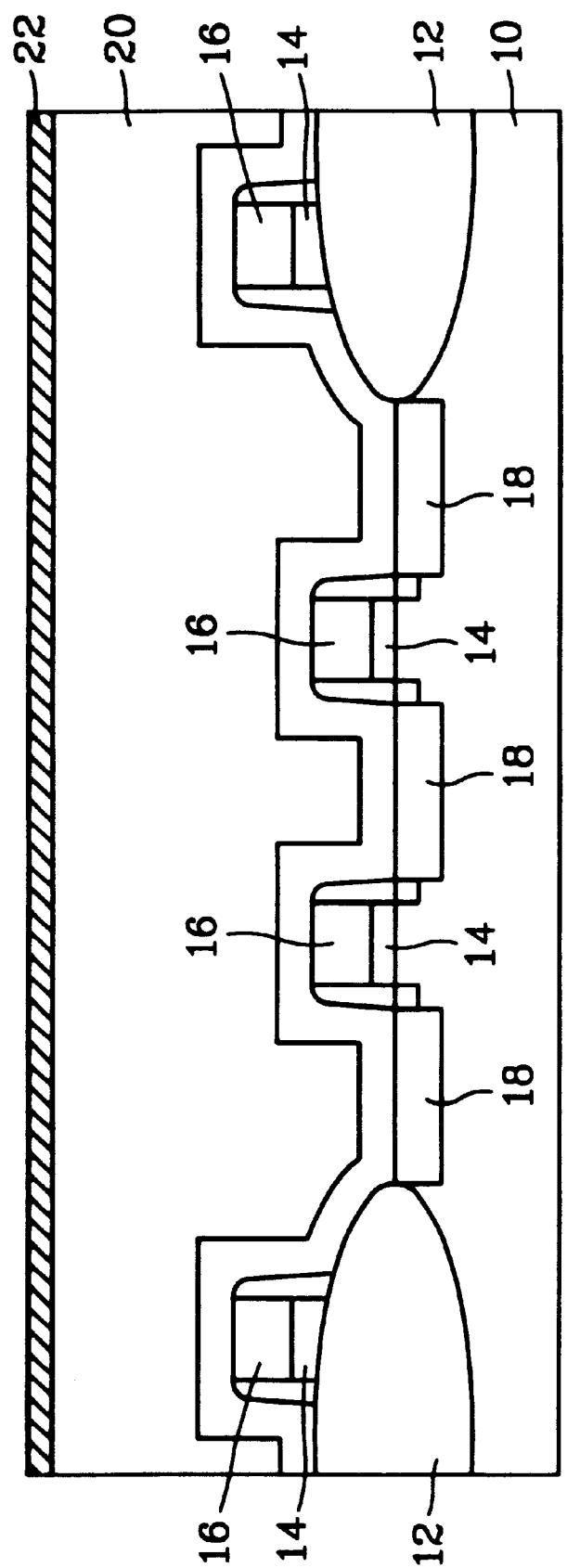
FIGS. 1 through 7 schematically illustrate the cross sectional view of a DRAM cell fabrication according to the present invention.

The invention disclosed herein is directed to a method of fabricating the cup-shape cylindrical capacitor of high density DRAMs. The drawing figures are illustrated a partially completed integrated circuit device. In the following description, numerous details are set forth in order to provide a thorough understanding of the present invention. It will be appreciated by one skilled in the art that variations of these specific details are while still achieving the results of the present invention. In other instance, well-known processing steps are not described in detail in order not unnecessarily to obscure the present invention.

Referring now more particularly to FIG. 1, there is shown a portion of partially completed Metal-Oxide-Semiconductor Field Effect Transistor (MOSFET). First, filed oxide regions 12 served for isolation are formed on a single crystalline semiconductor silicon substrates 10 to a thickness of about 3000 to 6000 Angstroms by the conventional localized oxidation of silicon (LOCOS) or shallow trench isolation (STI) techniques. Bitlines and MOSFET regions which are usually consist of gate oxides, gates 14, pad oxides 16, lightly doped regions, spacers, and source/drain regions 18 are then formed.

The gate 14 of the MOSFET is usually composed of polysilicon or polycide formed by low pressure chemical vapor deposition (LPCVD) to a thickness of about 2000 to 3500 Angstroms. The source/drain region 18 of the MOSFET which is formed by ion implantation technique, is preferably doped with arsenic ($As^{75}$) or phosphorus ($P^{31}$) ions, with an implantation dose of 2E15 to 5E16 $cm^{-2}$, and an implantation energy of 30 to 80 keV.

Referring to FIG. 1 again, the first dielectric 20 and second dielectric 22 layers are continuously deposited on the silicon substrate 10. The first dielectric layer 20 is usually using boronphosphosilicate glass (BPSG) which is formed by atmosphere CVD (APCVD) technique under the following conditions: a temperature is about 400° C., and a pressure is about 1.0 torr, with reactant gases of $Si(C_2H_5O)_4$, $N_2$ and TMB (Tri-Methyl-Borate). The thickness of the first dielectric layer 20 is about 3000 to 8000 Angstroms. Thereafter, the first dielectric layer 20 is planarized by thermal reflow, etchback or chemical mechanical polishing (CMP) techniques. Alternatively, The first dielectric layer 20 can be natural silicate glass (NSG) formed by LPCVD under a temperature about 720° C., a pressure about 0.25 torr, with reactant gases of $Si(C_2H_5O)_4$, $N_2O$ and $O_2$. Even Tetra-Ethyl-Ortho Silicate (TEOS) or BPSG/NSG multilayers can also work. The second dielectric layer 22 which serves as polysilicon etch stopper is usually using nitride ($SiN_x$) formed by LPCVD technique under the following conditions: a pressure is between 200 to 400 mTorr, with a temperature of about 720° C., and reactant gases $SiH_2Cl_2$ and $NH_3$ flowing to a thickness of 200 to 1000 Angstroms. Alternatively, the materials with high etch selectivity respect to polysilicon can also be used such as oxynitride (SiON).

Figure 2:
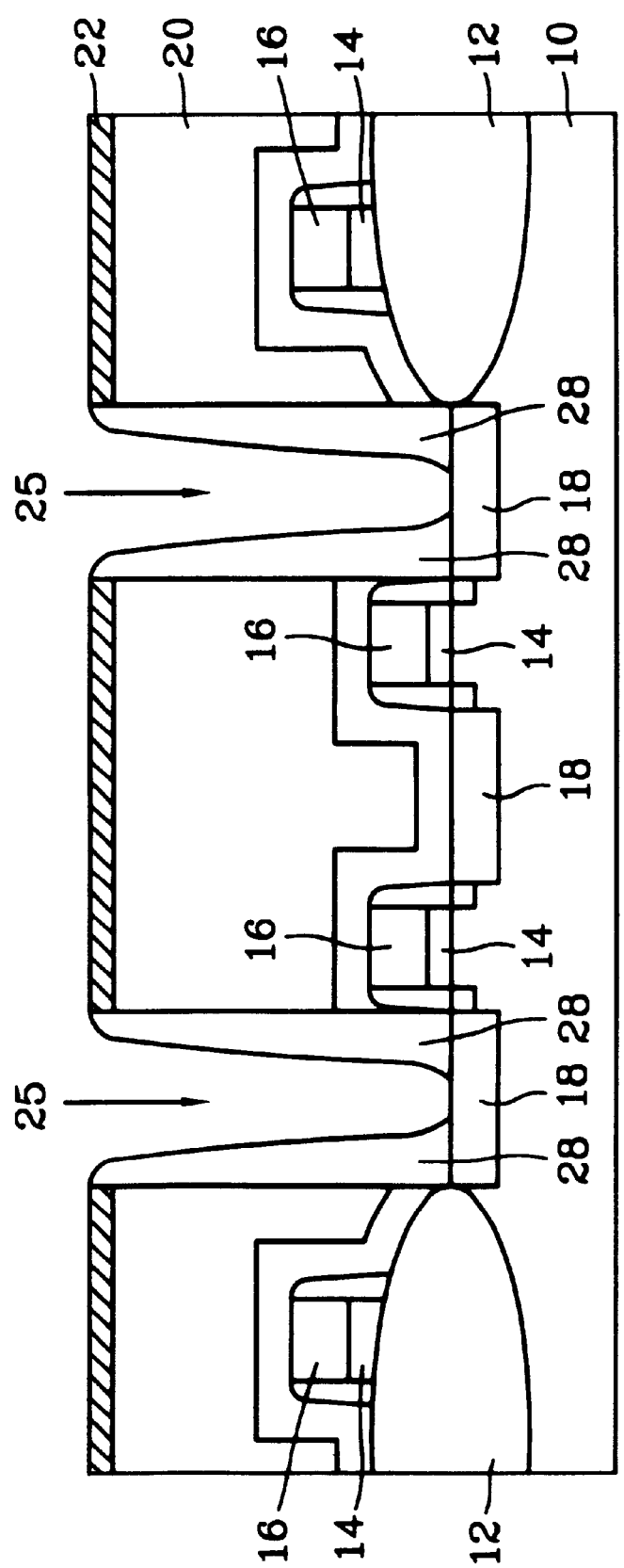

Referring now to FIG. 2, the first dielectric and second dielectric layers are partially etched to open cell contact windows 25 for the sources/drains 18 of the MOSFET by the conventional lithography and plasma-etching techniques. In order to ensure there is no electrically-short problem due to misalignment, sidewall spacers 28 may be formed inside the cell contact windows.

The plasma etching process can use magnetic enhanced reactive ion etching (MERIE), electron cyclotron etching (ECR) or reactive ion etching (RIE) methods with reactant gases such as $CF_4$, $CHF_3$ and Ar. The sidewall spacers 28 are usually composed of silicon dioxide such as TEOS by the LPCVD technique, followed by vertically anisotropically etching to complete the spacer formation.

Figure 3:
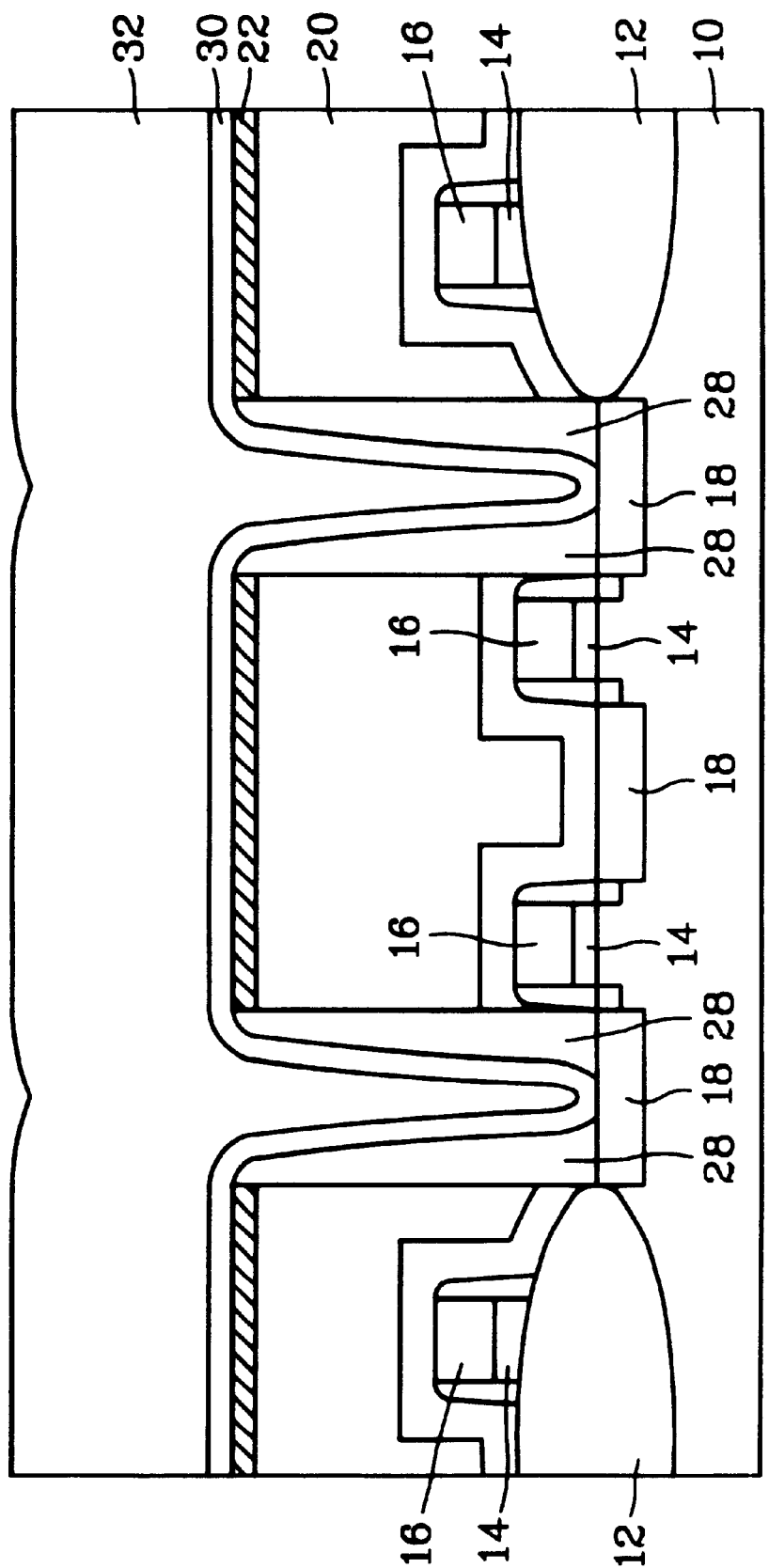

Referring now to FIG. 3, the first polysilicon layer 30 which is overlaying the second dielectric layer 22 and filling into the cell contact window 25 is deposited. Next, a third dielectric layer 32 is formed overlaying the first polysilicon layer 30 as shown in FIG. 3.

The first polysilicon layer 30 is usually formed by in-situ phosphorus doped LPCVD method under a mixture of 15% $PH_3$+85% $SiH_4$ and 5% $PH_3$+95% $N_2$, at a temperature about 550° C. to obtain a thickness of between 500 to 1500 Angstroms. The third dielectric layer 32 is usually using BPSG which is formed by APCVD technique as described above. The thickness of the third dielectric layer 32 is about 4000 to 10000 Angstroms. Thereafter, the third dielectric layer 32 is subjected to planarize. Alternatively, The third dielectric layer 32 can be NSG, phosphosilicate glass PSG), spin on glass (SOG) or the like.

Figure 4:
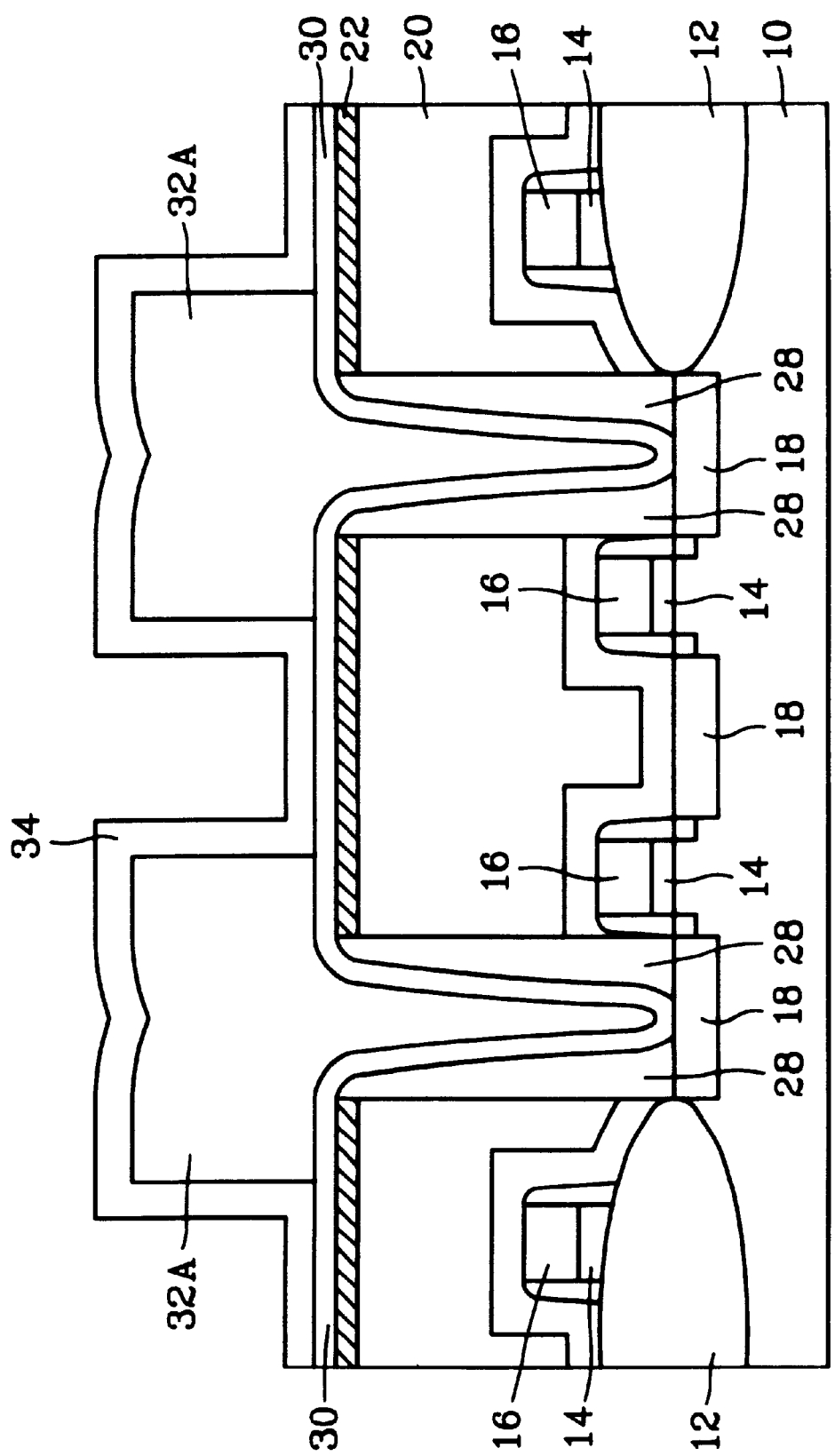

Referring now to FIG. 4. the third dielectric layer 32 is vertically etched to form third dielectric crowns 32A by the conventional lithography and plasma-etching techniques. Next, a second polysilicon layer 34 is deposited overlaying the third dielectric crowns 32A and first polysilicon layer 30 as shown in FIG. 4.

The third dielectric layer 32 plasma-etching process can still use MERIE, ECR or RIE methods with reactant gases such as $CF_4$, $CHF_3$ and Ar as described before. The second polysilicon layer 34 is also formed by in-situ phosphorus doped LPCVD method to a thickness of between 1000 to 2000 Angstroms. Alternatively, the second polysilicon 34 may be doped by ion implant technique.

Figure 5:
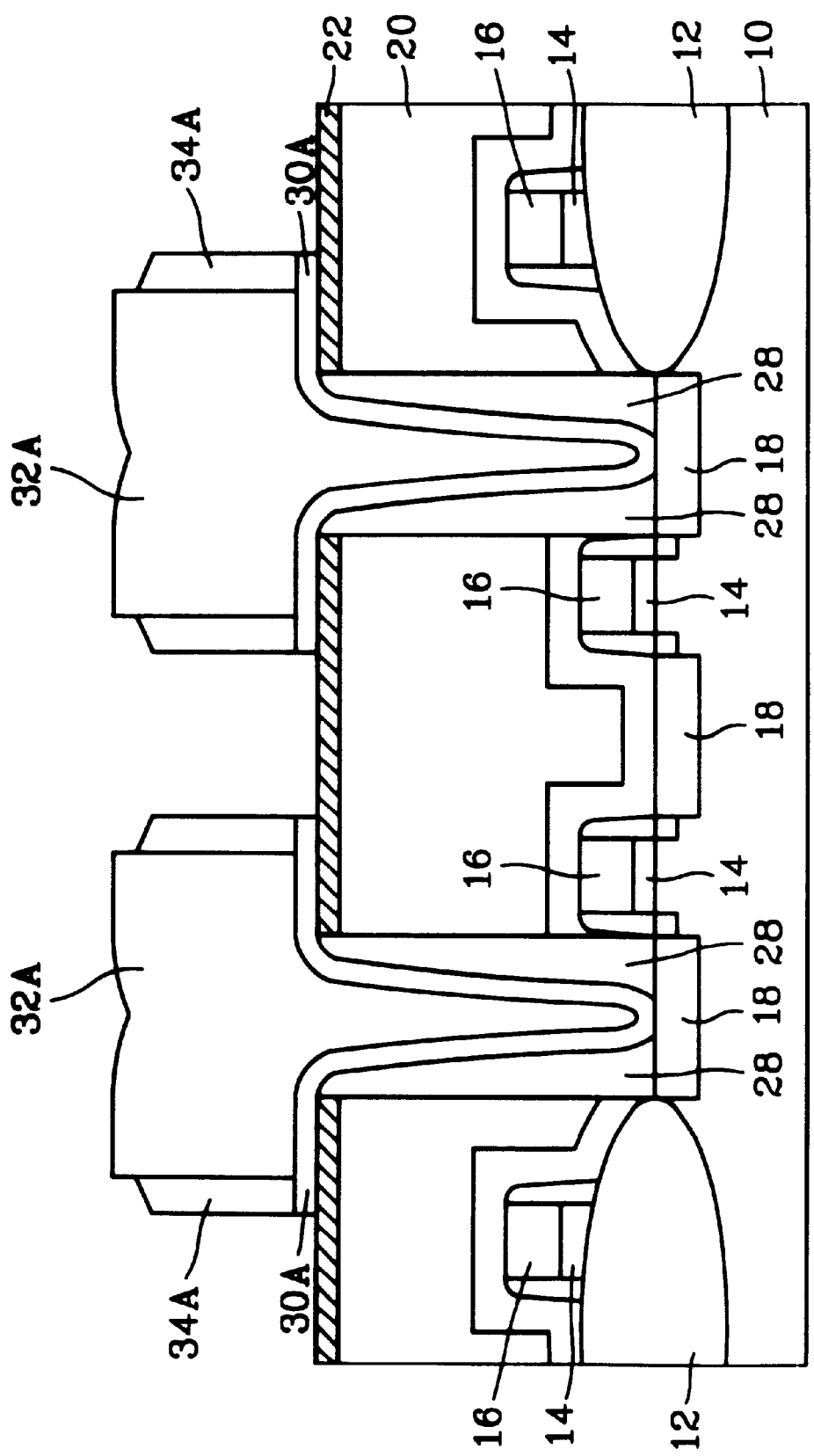

Referring now to FIG. 5. the first polysilicon 30 and second polysilicon 34 layers are vertically anisotropically etchback to define storage nodes of the cylindrical capacitors. The etchback process which is automatically stopped at the second dielectric layer 22 without damaging underlayers is usually employed MERIE method with reactant gases of $Cl_2$, $SF_6$ and HBr.

Figure 6:
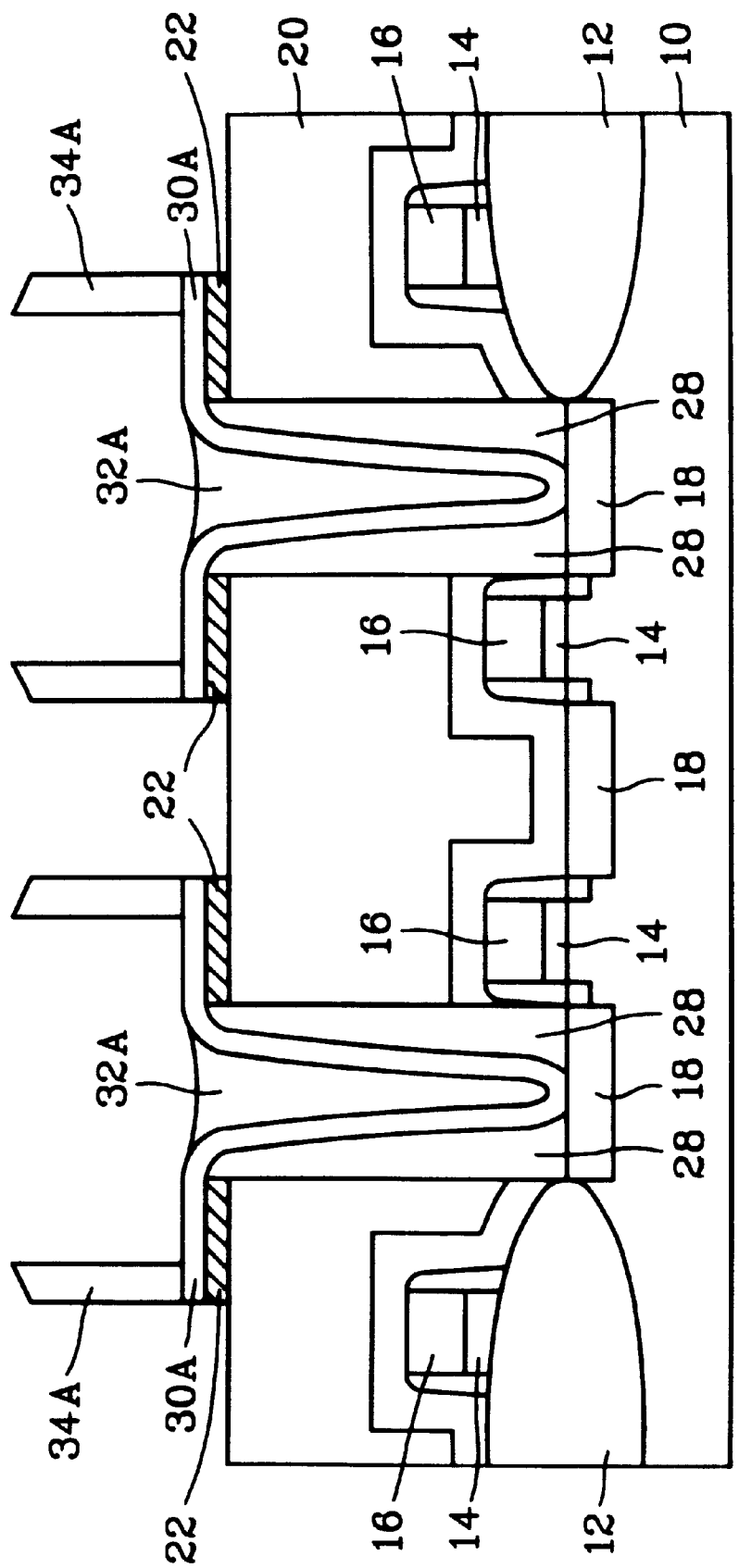

Referring now to FIG. 6, the third dielectric crowns 32A are removed by wet etching such as the mixture of hydrofluoric acid (HF) and ammonium fluoride ($NH_4F$) or buffer oxide etch (BOE). The remaining of the second dielectric layer 22 can be removed or left as it was. Thereafter, the cup shape storage nodes which are consist of the remaining of first polysilicon 30A and second polysilicon 34A layers according to the present invention are created as shown in FIG. 6.

Figure 7:
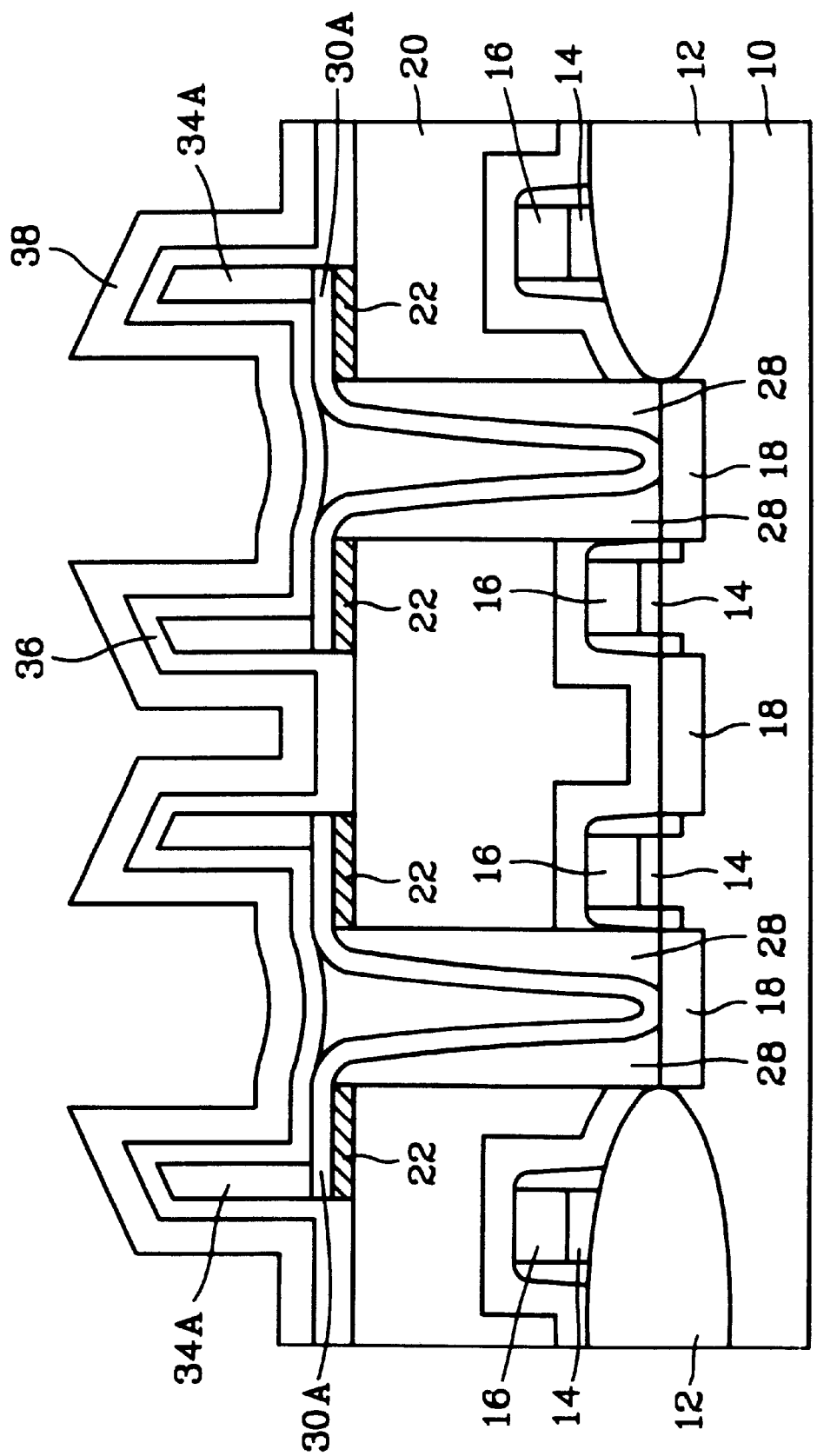

Referring now to FIG. 7, a capacitor dielectric layer 36 and a third polysilicon layer 38 as top plate of the capacitor are sequentially formed by standard integrated circuit processing procedure. The cup shape cylindrical capacitor for high density DRAM applications is finally accomplished. The capacitor dielectric layer 36 is usually using nitride/oxide (NO) doublelayer or oxide/nitride/oxide (ONO) triplelayer or even tantalum oxide ($Ta_2O_5$) material. The thickness of the capacitor dielectric layer 36 is about 20 to 150 Angstroms. The third polysilicon layer is deposited by the same method of the first polysilicon as described before. The thickness of the third polysilicon layer 38 is about 1000 to 2000 Angstroms.

While the invention has been particularly shown and described with reference to a preferred embodiment, it will be understood by those skilled in the art that various changes in form and detail may be made therein without departing from the spirit and scope of the present invention.

What we claimed is:

1. A method for fabricating a capacitor of a DRAM cell which has a field effect transistor including a gate, a drain and a source over a semiconductor substrate comprising:

(a) forming a first dielectric layer and a second dielectric layer over said substrate and said field effect transistor;

(b) forming a cell contact window by etching away part of said second dielectric layer and said first dielectric layer;

(c) forming an oxide spacer by LPCVD on the side wall of said contact window (d) forming a first polysilicon layer on said second dielectric layer and conformally covering the sidewalls and bottom of said contact window to contact the source/drain regions;

(e) forming a third dielectric layer on said first polysilicon layer and filling said contact window;

(f) etching away a portion of said third dielectric layer and leaving the portions in said contact window and above said contact hole to form a crown;

(g) forming a second polysilicon layer on the surface of said first polysilicon layer and said crown;

(h) anisotropically etching said second polysilicon layer and said first polysilicon layer, wherein said second polysilicon layers forms the side wall spacer of said crown, and said first polysilicon layer uncovered by said side wall spacer is removed;

(i) removing said crown and the remaining of said second dielectric layer in said contact hole, and the remaining first polysilicon layer and said side wall spacer forming the bottom electrode;

(j) forming a capacitor dielectric layer; and (k) forming a third polysilicon layer on said capacitor dielectric layer.

2. The method of claim 1, wherein said second dielectric layer uncovered by said bottom electrode is removed after removing said crown.

3. The method of claim 1, wherein said first dielectric layer is a material selecting from the group consisting of boronphosphosilicate glass (BPSG), non-doped silicate glass (NSG) and Tetra-Ethyl-Ortho Silicate (TEOS).

4. The method of claim 1, wherein said second dielectric layer is a material selecting from the group consisting of nitride ($SiN_x$) and oxynitride (SiON).

5. The method of claim 1, wherein the thickness of said second dielectric layer is about 200 to 1000 Angstroms.

6. The method of claim 1, wherein said third dielectric layer is a material selecting from the group consisting of BPSG, NSG, phosphosilicate glass (PSG) and spin on glass (SOG).

7. The method of claim 1, wherein the thickness of said third dielectric layer is about 4000 to 10000 Angstroms.

8. The method of claim 1, wherein said capacitor dielectric layer is a material selecting from the group consisting of nitride/oxide (NO) doublelayer, oxide/nitride/oxide (ONO) triplelayer and tantalum oxide ($Ta_2O_5$).

9. The method of claim 1, wherein the thickness of said capacitor dielectric layer is about 20 to 150 Angstroms.

10. The method of claim 1, wherein the thickness of said third polysilicon layer is about 1000 to 2000 Angstroms.

* * * * *